(12) United States Patent
Tanaka et al.

(10) Patent No.: US 6,310,135 B1
(45) Date of Patent: Oct. 30, 2001

(54) POLYIMIDE RESIN COMPOSITION

(75) Inventors: Akira Tanaka; Satoshi Tazaki; Yasuhiro Yoneda; Kishio Yokouchi, all of Kanagawa (JP)

(73) Assignee: Nippon Zeon Co., Ltd., Tokyo (JP)

(*) Notice: Subject to any disclaimer, the term of this patent is extended or adjusted under 35 U.S.C. 154(b) by 0 days.

(21) Appl. No.: 08/945,277

(22) PCT Filed: Apr. 17, 1996

(86) PCT No.: PCT/JP96/01045

§ 371 Date: Feb. 20, 1998

§ 102(e) Date: Feb. 20, 1998

(87) PCT Pub. No.: WO96/33239

PCT Pub. Date: Oct. 24, 1996

(30) Foreign Application Priority Data

Apr. 18, 1995 (JP) .................................................. 7-116336

(51) Int. Cl.⁷ .............................. C08L 39/00; C08G 73/10
(52) U.S. Cl. ...................... 524/548; 524/600; 524/607; 528/170; 528/172; 528/126; 528/188; 528/350; 528/353; 430/270.1; 430/283.1
(58) Field of Search .................................... 524/548, 600, 524/607; 528/170, 172, 126, 188, 350, 353; 430/270.1, 283.1

(56) References Cited

U.S. PATENT DOCUMENTS

| | | |
|---|---|---|
| Re. 30,186 | 1/1980 | Rubner et al. . |
| 3,957,512 | 5/1976 | Kleeberg et al. . |
| 4,032,691 * | 6/1977 | Kido et al. ........................ 428/318.4 |
| 4,040,831 | 8/1977 | Rubner et al. . |
| 4,243,743 | 1/1981 | Hiramoto et al. . |
| 4,650,849 * | 3/1987 | Nishimura et al. ..................... 528/26 |
| 4,985,343 | 1/1991 | Kushi et al. . |
| 4,991,285 * | 2/1991 | Shaheen et al. ....................... 29/830 |
| 5,346,927 | 9/1994 | Onishi et al. ........................... 521/90 |
| 5,385,808 * | 1/1995 | Tokoh et al. .......................... 430/283 |
| 5,506,021 * | 4/1996 | Bistervels et al. ................... 428/64.1 |
| 5,587,275 * | 12/1996 | Kato ................................... 430/283.1 |
| 5,756,260 * | 5/1998 | Sashida et al. ..................... 430/283.1 |

FOREIGN PATENT DOCUMENTS

| | | |
|---|---|---|
| 0304136 | 2/1989 | (EP) . |
| 0355927 | 2/1990 | (EP) . |
| 0566312 | 10/1993 | (EP) . |
| 54-145794 | 11/1979 | (JP) . |
| 55-30207 | 8/1980 | (JP) . |
| 55-41422 | 10/1980 | (JP) . |
| 59-52822 | 12/1984 | (JP) . |
| 60-157286 | 8/1985 | (JP) . |
| 1-174439 | 7/1989 | (JP) . |
| 2-228359 | 9/1990 | (JP) . |
| 5-198559 | 8/1993 | (JP) . |
| 6-242613 | 9/1994 | (JP) . |
| 8-82931 | 3/1996 | (JP) . |
| 8-95247 | 4/1996 | (JP) . |

OTHER PUBLICATIONS

Handbook of Thhermoplastics, O. Olabisi, Marcel Dekker, Inc,, 1997, pp.683–684.*
Saegusa et al, *Chemical Communications* (1968), 273–274.
Derwent WPI Abstract No. XP–002064315 regarding Japanese Application No. JP 5–127384 of May 25, 1993.
Patent Abstracts of Japan of Japanese Application No. 61–82326 of Apr. 25, 1986.

* cited by examiner

*Primary Examiner*—David W. Wu
*Assistant Examiner*—Tanya ZaLuKawa
(74) *Attorney, Agent, or Firm*—Dinsmore & Shohl LLP

(57) ABSTRACT

A polyimide resin composition comprising a polyimide resin (A) and at least one 1H-tetrazole (B) selected from the group consisting of 1H-tetrazole, 5,5'-bis-1H-tetrazole, and derivatives thereof, and having an excellent rust preventing effect on copper and copper alloys.

8 Claims, No Drawings

POLYIMIDE RESIN COMPOSITION

TECHNICAL FIELD

The present invention relates to polyimide resin compositions for electronic materials, which have excellent effects on copper and copper alloys for preventing rust, which form films that are easily dissolved and removed, and which form closely adhering cured films. The polyimide resin compositions according to the present invention can be suitably used in applications for forming layer insulation films, protective films and the like on substrates of semiconductor devices and the like.

In the present invention, the polyimide resins mean not only polyimide in a narrow sense, but also polyimide precursors such as polyamide acids, photosensitive polyimide resins, and the like. The photosensitive polyimide resins include those containing a photosensitive auxiliary, a photopolymerization initiator, a sensitizer and the like.

BACKGROUND ART

The polyimide resins have advantages such as low dielectric constant, excellent film-forming properties on a large substrate, high heat resistance and high chemical resistance and are hence used in wide fields as insulating materials and materials for protective films for electronic parts. In semiconductor devices such as IC, LSI, power diode and GTO thyristor, a polyimide film is used as a layer insulation film, passivation film or junction coating. A polyimide film is used as a layer insulation film or protective film in IC-mounted substrates for computers, thermal heads, line sensors, and high performance substrates for COG type liquid crystal televisions and the like.

In the case of a photoresist, it is separated and removed after its role is accomplished in an etching process. However, a layer insulation film, a passivation film or the like in a semiconductor device remains unremoved as a permanent film, and is hence required to have high electrical and mechanical properties. These films must also resist a high temperature (300–350° C.) applied in a fabrication process of the semiconductor. The polyimide film is suitable for such a purpose. Polyimide varnishes for formation of polyimide films enjoy an increasing demand in a field of electrical insulating coating.

The polyimide film is generally formed by coating a substrate with a varnish of a polyamide acid (polyamic acid), which is a precursor of polyimide, to form a film and then dehydrating the polyamide acid to cyclize it, thereby polyimidating it. In order to selectively provide a polyimide film at a minute part, it is necessary to form a coating film of a polyamide acid on the whole surface of a substrate, form a pattern on the surface with a photo-resist and etch the polyamide acid with hydrazine or the like.

On the other hand, photosensitive polyimide resins the solubility of which is changed by irradiation of light have been developed in recent years. For example, photosensitive polyimide resin compositions obtained by adding a photo-crosslinking agent to a polyamide acid, polyimide precursors obtained by introducing an acryloyl group into a polyamide acid (Japanese Patent Publication Nos. 30207/1980 and 41422/1980), polyimide precursors obtained by introducing an acryloyl group in the form of a salt into a polyamide acid (Japanese Patent Publication No. 52822/1984), and polyimide precursors obtained by introducing an o-nitrobenzyl ester group into a polyamide acid have been proposed. When such a photosensitive polyimide resin (precursor) is used, a pattern is formed by irradiation of light, and the polyimide resin is cyclized by a heat treatment, thereby forming polyimide.

A method of imparting photosensitivity to polyimide itself, not to a polyimide precursor has been recently developed. Since polyimide is difficult to be dissolved in a solvent, it has been proposed, for example, to use an asymmetric diamine, thereby obtaining solvent-soluble polyimide, or to obtain polyimide, which is soluble in a solvent and has photosensitivity, from benzophenonetetracarboxylic acid anhydride and an aromatic diamine.

However, the polyimide resins (polyimide and polyimide precursors) have been found to have corrosiveness against metals such as copper and copper alloys (brass and the like), which are in use as conductive materials. The corrosiveness is caused by the fact that a polyamide acid as a polyimide precursor contains carboxyl groups, and the carboxyl groups often remain even after its polyimidation. These carboxyl groups react with copper and copper alloys to corrode them.

Accordingly, for example, when a varnish containing a polyamide acid is used to form a layer insulation film for a multilayer distributing board, a corroding action and generation of copper ions occur in copper or a copper alloy coming into contact with the coating film during the process of heat curing (polyimidation) or after the curing, thereby causing various problems such as insulation failure, breaking of wire, short, rust at metal parts, lowing in adhesion of the film and deterioration of physical properties of the film.

When a varnish of a photosensitive polyamide acid is used to form a film of polyimide, the film tend to remain at unexposed portions thereof upon development due to the reaction of the carboxyl group in the polyamide acid with copper or a copper alloy, so that a difficulty may be encountered on the formation of a good pattern in some cases. More specifically, when the carboxyl group in the polyamide acid is reacted with copper, carboxyl copper (copper salt) is formed. The polyamide acid, in which carboxyl copper has been formed, is lowered in its own solubility in solvents, which forms the cause that a film formed remains undissolved at unexposed portions thereof when development is conducted with a solvent after exposure.

The carboxyl copper is oxidized by dissolved oxygen to form a bivalent copper ion. The copper ion forms the causes of not only the reduction in electrical insulating property, but also lowering in the molecular weight of polyimide formed, lowering in the physical properties and adhesion of the film, and the like. It has been reported that when the bivalent copper ion is combined with an acrylic monomer, migration of an electron occurs to conduct radical polymerization (Chem. Commun., 1968, 273). Even in the photosensitive polyamide acids, those having an acryloyl group as a photosensitive group tend to incur the retention of a film formed at unexposed portions thereof upon development under the influence of the copper ion in particular.

In order to improve the adhesion between a substrate and a polyimide film, some proposals have heretofore been made. For example, it has been proposed to provide a layer of a silane coupling agent on the surface of a copper layer, thereby improving its adhesion to a polyimide film (Japanese Patent Application Laid-Open No. 174439/1989), to add a compound selected from among benzotriazole, 1,2,4-triazole, and these derivatives to a polyamide acid, thereby restraining corrosiveness of the polyamide acid (Japanese Patent Application Laid-Open No. 228359/1990) and to add a silane coupling agent to a polyamide acid varnish, thereby improving the adhesion of a polyimide film formed to a substrate (Japanese Patent Application Laid-Open No. 157286/1985).

However, the varnishes containing these compounds involve a problem that their storage stability is deteriorated. In particular, a silane coupling agent is unstable to humidity. Therefore, the polyamide acid varnish, to which the silane coupling agent is added, involves a problem as to storage stability.

In a method of using the photosensitive polyamide acid to form a polyimide pattern on a copper wiring, in some cases, a film of the polyamide acid may have remained undissolved at unexposed portions thereof upon development due to the migration of a copper ion caused by the reaction of a carboxyl group in the polyamide acid with copper, or humidity resistance of a polyimide film formed and its adhesion to the copper wiring may have been deteriorated. Therefore, it has been generally conducted to plate the copper wiring with chromium or the like where the photosensitive polyamide acid is used. In addition, it has been proposed to conduct patterning of a polyamide acid film on a copper layer subjected to a surface treatment by, for example, a method in which the surface of the copper layer is subjected to a surface treatment with a silicon compound having an amino group (Japanese Patent Application Laid-Open No. 242613/1994), or a method in which the surface of the copper layer is treated with oxygen or a chemical to form a film of copper oxide (Japanese Patent Application Laid-Open No. 198559/1993).

Since the method of subjecting the surface of the copper layer to the plating treatment and the method of subjecting the surface of the copper layer to the chemical treatment to form the copper oxide film thereon increase the number of steps, however, their workability and profitability become poor. Therefore, such method are not preferred.

It has also been known to treat the surface of a copper layer with a rust preventive. Many of rust preventives are composed of a basic compound such as an amine compound, a sulfur-containing compound having a coordinating effect on a copper atom, the sodium salt of an organic carboxylic acid, a hydrazine derivative, or a phenol derivative.

However, the amine compound reacts to the carboxyl group in the polyamide acid to reduce its rust preventing effect. As a result, the formation of copper ions can not be completely prevented. In particular, its effect on the photosensitive polyamide acid in which a polymerizable acrylate site is present is insufficient. The sulfur-containing compound, sodium salt of the organic carboxylic acid, hydrazine derivative and phenol derivative are insufficient in rust preventing effect and moreover form the cause of corrosion where a sulfur atom or a sodium atom remains in the resulting insulating film.

DISCLOSURE OF THE INVENTION

It is an object of the present invention to provide a polyimide resin composition for electronic materials, which has excellent effects on copper and copper alloys for preventing rust, which forms a film that is easily dissolved and removed, and which forms a cured film that closely adheres to a surface, in the absence of plating and surface treatment with a rust preventative.

The present inventors have carried out an extensive investigation with a view toward overcoming the above-described problems involved in the prior art. As a result, it has been found that the above object can be achieved by containing a 1H-tetrazole such as 1H-tetrazole, 5,5'-bis-1H-tetrazole, or a derivative thereof in a polyimide resin such as a polyamide acid, solvent-soluble polyimide, photosensitive polyamide acid, photosensitive polyamide acid ester or photosensitive polyimide. The resin composition obtained by compounding the 1H-tetrazole into any of these polyimides and polyimide precursors is generally used as a solution (varnish) with the individual components evenly dissolved in a solvent.

The polyimide resin composition, in which the 1H-tetrazole is compounded, has an excellent corrosion preventing effect on copper and copper alloys. A photosensitive resin composition according to the present invention, such as a photosensitive polyamide acid resin composition, permits the formation of a film excellent in effect of preventing the film from remaining at unexposed portions thereof and adhesion to a substrate without lowering its sensitivity and resolution. Besides, a film obtained from the polyimide resin composition according to the present invention is improved in elongation at break.

The present invention has been led to completion on the basis of these findings.

According to the present invention, there is thus provided a polyimide resin composition comprising a polyimide resin (A) and at least one 1H-tetrazole (B) selected from the group consisting of 1H-tetrazole, 5,5'-bis-1H-tetrazole, and derivatives thereof.

The polyimide resin useful in the practice of the present invention may preferably be at least one polyimide resin selected from the group consisting of polyamide acids, solvent-soluble polyimides, photosensitive polyamide acids, photosensitive polyamide acid esters and photosensitive polyimides.

BEST MODE FOR CARRYING OUT THE INVENTION

The present invention will hereinafter be described in detail.

1H-Tetrazole

The greatest feature of the present invention resides in that a 1H-tetrazole such as 1H-tetrazole, 5,5'-bis-1H-tetrazole, or a derivative thereof is added to a polyimide resin such as a polyamide acid, solvent-soluble polyimide, photosensitive polyamide acid, photosensitive polyamide acid ester or photosensitive polyimide, thereby preventing corrosion against copper and copper alloys, and in its turn improving the adhesion of a polyimide film cured to a substrate and preventing a photosensitive film formed from remaining at unexposed portions without being dissolved.

1H-Tetrazole and derivatives thereof are compounds represented by the following formula (1):

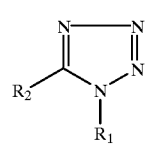

(1)

5,5'-Bis-1H-tetrazole and derivatives thereof are compounds represented by the following formula (2):

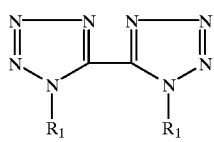

In these formulae (1) and (2), the definitions of $R_1$ and $R_2$ are as follows.

Definition of $R_1$:

In the formulae (1) and (2), $R_1$ is a hydrogen atom, an alkyl group having 1–10 carbon atoms, an alkenyl group having 2–10 carbon atoms, an allyl group having 3–10 carbon atoms, an alicyclic group having 3–6 carbon atoms, a phenyl group, a substituted phenyl group represented by the following formula (3):

wherein n is an integer of 1–3, and X is an alkyl group having 1–10 carbon atoms, an alkoxyl group having 1–10 carbon atoms, —NR'R" (R' and R" are independently a hydrogen atom or a methyl, ethyl, acetyl or ethylcarbonyl group), —COOH, —COOCH$_3$, —NO$_2$, —OH, —SH or —SCH$_3$, or a substituted methyl group represented by the following formula (4):

wherein m is an integer of 1–10, and Y is —COOH, —NR'RN" (R' and R" are independently a hydrogen atom or a methyl, ethyl, acetyl or ethylcarbonyl group), a phenyl group or a substituted phenyl group represented by the formula (3).

Among these substituents, preferable specific examples of $R_1$ include a hydrogen atom; alkyl groups having 1–6 carbon atoms, such as methyl, ethyl, propyl, isopropyl, butyl, isobutyl, s-butyl, t-butyl, pentyl, 3-methyl-1-butyl, hexyl and 4-methyl-1-pentyl groups; alicyclic groups having 3–6 carbon atoms, such as cyclopropyl, cyclopentyl, 2-methylcyclopentyl and cyclohexyl groups; a phenyl group; substituted phenyl groups represented by the general formula (3) in which n is 1 or 2, and X is an alkyl group having 1–6 carbon atoms, amino group, methylamino group, acetamide group, —SH or —OH, for example, methylphenyl, dimethylphenyl, butylphenyl, t-butylphenyl, aminophenyl, aminomethylphenyl, acetamidophenyl, mercaptophenyl and hydroxyphenyl groups; and substituted methyl groups represented by the general formula (4) in which m is 1 or 2, and Y is a phenyl, amino, methylamino, dimethylamino or acetamide group, for example, aralkyl groups such as benzyl and phenethyl groups, and (substituted) aminomethyl groups such as aminomethyl, aminoethyl, methylaminomethyl, dimethylaminomethyl and acetylaminomethyl groups.

Definition of $R_2$:

In the formula (1), $R_2$ is a hydrogen atom, a hydroxyl group, a cyano group, an alkyl group 1–10 carbon atoms, an alkenyl group having 2–10 carbon atoms, an alkinyl group having 2–10 carbon atoms, an alicyclic group having 3–6 carbon atoms, a phenyl group, a substituted phenyl group, —OR$_3$ ($R_3$ is an alkyl group 1–10 carbon atoms, an alkenyl group having 2–10 carbon atoms, an alkinyl group having 2–10 carbon atoms, a phenyl group or a substituted phenyl group represented by the formula (3)), a substituted methyl group represented by the following formula (5):

wherein k is an integer of 1–10, and Z is a halogen atom, an amino group, —NR'R" (R' and R" are independently a hydrogen atom or a methyl, ethyl, acetyl or ethylcarbonyl group), a phenyl group, a substituted phenyl group represented by the formula (3), —SH, —SR$_4$ ($R_4$ is an alkyl group 1–10 carbon atoms, an alkenyl group having 2–10 carbon atoms, an alkinyl group having 2–10 carbon atoms, a phenyl group or a substituted phenyl group represented by the formula (3)), —C(NH$_2$)H—(CH$_2$)$_n$—CH$_3$ (n: 1–5) or —C(NHCH$_3$)H—(CH$_2$)$_n$—CH$_3$ (n: 0–5), or a group represented by the following formula (6):

wherein A is —CO—, —NHCO—, —C(=N—OH)—, —CH(OH)—, —CH(NH$_2$)—, —CH(Cl)— or —CH(Br)—, and $R_5$ is an alkyl group having 1–20 carbon atoms, an alkenyl group having 2–20 carbon atoms, an alicyclic group having 3–6 carbon atoms, a phenyl group, a substituent phenyl group represented by the formula (3), a substituted methyl group represented by the formula (5) or a group represented by the following formula (7):

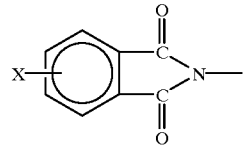

wherein X is an alkyl group having 1–10 carbon atoms, an alkoxyl group having 1–10 carbon atoms, an amino group, —NR'R" (R' and R" are a hydrogen atom or a methyl, ethyl, acetyl or ethylcarbonyl group), —COOH, —COOCH$_3$, —NO$_2$, —OH, —SH or —SCH$_3$.

Preferable specific examples of $R_2$ include a hydrogen atom; a cyano group; alkyl groups having 1–6 carbon atoms, such as methyl, ethyl, propyl, isopropyl, butyl, isobutyl, s-butyl, t-butyl, pentyl, 3-methyl-1-butyl, hexyl and 4-methyl-1-pentyl group; alicyclic groups having 3–6 carbon atoms, such as cyclopropyl, cyclopentyl, 2-methylcyclopentyl and cyclohexyl groups; a phenyl group; substituted phenyl groups having a $C_1$–$C_6$ alkyl group, such as methylphenyl, ethylphenyl, propylphenyl, butylphenyl, pentylphenyl and hexylphenyl groups; (substituted) aminophenyl groups such as aminophenyl, methylaminophenyl and acetamidophenyl groups; and substituted methyl groups represented by the general formula (5) in which k is 1 or 2, and Z is a phenyl, amino, methylamino, dimethylamino or acetamide group, for example, aralkyl groups such as benzyl and phenethyl groups, and (substituted) aminomethyl groups such as aminomethyl, aminoethyl, methylaminomethyl, dimethylaminomethyl and acetylaminomethyl groups.

As preferable specific examples of 1H-tetrazole, 5,5'-bis-1H-tetrazole, and derivatives thereof, may be mentioned unsubstituted 1H-tetrazole; 5-substituted 1H-tetrazoles such as 5-methyl-1H-tetrazole, 5-phenyl-1H-tetrazole and 5-amino-1H-tetrazole; 1-substituted 1H-tetrazoles such as 1-methyl-1H-tetrazole; and 1- and 5-disubstituted 1H-tetrazole such as 1-phenyl-5-mercapto-1H-tetrazole. Of these, 1H-tetrazole and 5-substituted 1H-tetrazoles, in which $R_1$ is H, are particularly preferred.

The 1H-tetrazoles used in the present invention have a particularly high effect where $R_1$ is a hydrogen atom. The reason for it is as follows. When a hydrogen atom is bonded to a nitrogen atom at each 1-position of the 1H-tetrazoles, such a hydrogen ion (proton) in an aqueous solution shows acidity of the same degree as acetic acid, and so a salt can be easily formed with a metal or base. Accordingly, the 1H-tetrazoles react to copper or a copper alloy to form copper salts. These copper salts are stable to oxidation and prevent the isolation of a copper ion. In addition, the 1H-tetrazoles are considered to inhibit a reaction of a carboxyl group in the polyamide acid with copper or a copper alloy to prevent the formation of copper carboxylate.

On the other hand, the 1H-tetrazoles in which $R_1$ is another substituent than a hydrogen atom, show basicity and are considered to have an action to neutralize carboxyl groups in the polyamide acid rather than an action on copper. However, even use of such a tetrazole brings about action and effect that the rate of residual film is improved low though its effect is somewhat low.

The 1H-tetrazoles are also effective when they are added to the solvent-soluble polyimide, photosensitive polyimide or photosensitive polyamide acid ester. These polyimide resins are such that the carboxyl groups in the polyamide acid have been converted into imide bonds or ester bonds, and are difficult to cause a reaction with copper. However, their conversion into the imide bonds or ester bonds does generally not reach 100%, and so a small amount of the carboxyl groups may remain in some cases. Besides, it is considered that during storage of these polyimide resins in the form of a solution, the imide bonds or ester bonds are hydrolyzed by water existing in each solution to form carboxyl groups. The 1H-tetrazoles have an effect of inhibiting a reaction of the carboxyl groups thus formed with copper.

The 1H-tetrazoles are generally used in a proportion of 0.05–20 parts by weight, preferably 0.1–5 parts by weight, more preferably 0.3–3.0 parts by weight, per 100 parts by weight (in terms of solids) of the polyimide resin. If this proportion is too low, the effect of the addition becomes small. If the proportion is too high on the other hand, the effect is not brought about correspondingly to such a proportion.

The 1H-tetrazoles are generally added to a solution of the polyimide resin into a resin composition (solution). The resultant composition is used in applications for coating on a substrate or the like to form a film.

Polyimide Resin

In the present invention, a polyamide acid, solvent-soluble polyimide, photosensitive polyamide acid, photosensitive polyamide acid ester or photosensitive polyimide may be used as the polyimide resin.

The polyamide resin useful in the practice of the present invention is generally synthesized by using a tetracarboxylic acid or the acid anhydride thereof as an acid component and a diamine compound as an amine component, and subjecting both components to a condensation reaction at 0–100° C. in an organic polar solvent under water-free conditions.

The photosensitive polyamide acid or photosensitive polyamide acid ester can be obtained by a method in which an acryloyl group, which is photopolymerizable, is introduced into a polyamide acid or polyamide acid ester, or a method in which an actinic ray-sensitive functional group is introduced into the above compound at terminals thereof.

The photosensitive polyamide acid and photosensitive polyamide acid ester may contain a photopolymerization initiator, a photosensitizer, a photosensitive auxiliary (crosslinking aid) and the like as needed.

As the solvent-soluble polyimide and photosensitive polyimide, those mentioned above in BACKGROUND ART may be used.

Diamine Compound

Examples of the diamine compound include aromatic diamines such as 2,2'-di(p-aminophenyl)-6,6'-bisbenzoxazole, 2,2'-di(p-aminophenyl)-5,5'-bisbenzoxazole, m-phenylenediamine, 1-isopropyl-2,4-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 4,4"-diamino-p-terphenyl, 3,3"-diamino-p-terphenyl, bis(p-aminocyclohexyl)methane, bis(p-β-amnino-t-butylphenyl) ether, bis(p-β-methyl-δ-aminopentyl)benzene, p-bis(2-methyl-4-aminopentyl)benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2, 5-diamine, p-xylene-2,5-diamine, m-xylylenediamine and p-xylylenediamine; heterocyclic diamines such as 2,6-diaminopyridine, 2,5-diaminopyridine and 2,5-diamino-1,3,4-oxadiazole; alicyclic diamines such as 1,4-diarnino-cyclohexane; aliphatic diamines such as piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylene-diamine, 4,4-dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane and 2,17-diaminoeicosane; and besides diaminosiloxane, 2,6-diamino-4-carboxylic benzene and 3,3'-diamino-4,4'-dicarboxylic benzidine.

These diamine compounds may be used either singly or in any combination thereof. Of these, 2,2'-di(p-aminophenyl)-6,6'-bisbenzoxazole and 2,2'-di(p-aminophenyl)-5,5'-bisbenzoxazole are particularly preferred because polymers having low thermal expansiveness and high heat resistance can be provided.

Tetracarboxylic Acid or the Acid Anhydride Thereof

Examples of the tetracarboxylic acid or the acid anhydride thereof include aromatic tetracarboxylic acid dianhydrides such as pyromellitic dianhydride, 3,3'4,4'-benzophenone tetracarboxylic acid dianhydride, benzene-1,2,3,4-tetracarboxylic acid dianhydride, 2,2',3,3'-benzophenone tetracarboxylic acid dianhydride, 2,3,3'4'-benzophenone tetracarboxylic acid dianhydride, naphthalene-2,3,6,7-tetracarboxylic acid dianhydride, naphthalene-1,2,5,6- tetracarboxylic acid dianhydride, naphthalene-1,2,4,5-tetracarboxylic acid dianhydride, naphthalene-1,2,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 2,3",4,4"-p-terphenyltetracarboxylic acid dianhydride, 2,2",3,3"-p-terphenyltetracarboxylic acid dianhydride, 2,3,3",4"-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,81-tetracarboxylic acid dianhydride, phenanthrene-1,2,6,7-tetracarboxylic acid dianhydride and phenanthrene-1,2,9,10-tetracarboxylic acid dianhydride, and hydrogenated products thereof; alicyclic acid dianhydrides such as cyclopentane-1,2,3,4-tetracarboxylic acid dianhydride, cyclobutanetetracarboxylic acid dianhydride, bicyclo[2,2,2]oct-7-ene-2-exo,3-exo,5-exo,6-exo-tetracarboxylic acid 2,3:5,6-dianhydride and bicyclo-[2,2,1]heptane-2-exo,3-exo,5-exo,6-exotetracarboxylic acid 2,3:5,6-dianhydride; and heterocyclic derivatives such as pyrazine-2,3,5,6-tetracarboxylic acid dianhydride, pyrrolidine-2,3,4,5-tetracarboxylic acid dianhydride and thiophene-2,3,4,5-tetracarboxylic acid dianhydride.

These compounds may be used either singly or in any combination thereof. Of these, pyromellitic dianhydride, 3,3'4,4'-benzophenone tetracarboxylic acid dianhydride and a combination thereof are particularly preferred from the viewpoint of the realization of good low thermal expansiveness, resistance to cracking and resolution.

Introduction of Actinic Ray-sensitive Functional Group

In the present invention, various kinds of photosensitive polyamide acids and photosensitive polyamide acid esters may be used as the polyimide resins. Among these, polyamide acids with an actinic ray-sensitive functional group introduced at terminals thereof are preferred.

As specific examples thereof, may be mentioned polyamide acids with an actinic ray-sensitive functional group introduced at their terminals by causing, for example, a trimellitic acid derivative such as tris(acryloyl) pentaerythritol anhydrotrimellitate or tris(methacryloyl) pentaerythritol anhydrotrimellitate (Japanese Patent Application No. 256222/1994); an aminobenzene derivative such as tris(methacryloyl)pentaerythritol p-aminobenzoate (Japanese Patent Application No. 247109/1994); or the like to exist upon the synthesis of a polyamide acid.

Such actinic ray-sensitive functional group-introduced polyamide acids can be synthesized by ① a method in which a trimellitic acid derivative and a tetracarboxylic acid or the acid anhydride thereof are added to a diamine compound, and these components are subjected to a condensation reaction in accordance with a method known per se in the art, ② a method in which a tetracarboxylic acid or the acid anhydride thereof is added to a mixture of a diamine compound and a trimellitic acid derivative, and these components are subjected to a condensation reaction in accordance with a method known per se in the art, or ③ a method in which a tetracarboxylic acid or the acid anhydride thereof is added to a mixture of a diamine compound and an aminobenzenecarboxylic acid ester, and these components are subjected to a condensation reaction in accordance with a method known per se in the art.

Preferred as the polyamide acids with an actinic ray-sensitive functional group introduced at each terminal thereof are polyamide acids having, at both terminals thereof, at least one actinic ray-sensitive functional group selected from the group consisting of a group $Z^1$ represented by the following formula (8) and a group $Z^2$ represented by the following formula (9):

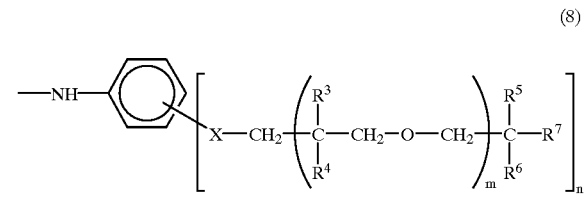

(8)

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are independently a substituent group having a photopolymerizable carbon-carbon double bond, m is 0 or 1, and n is an integer of 1–3;

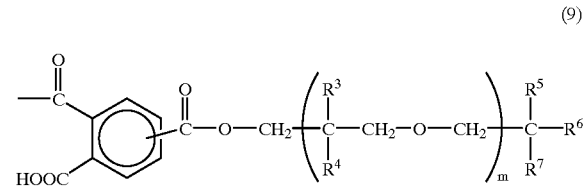

(9)

wherein $R^3$, $R^4$, $R^5$, $R^6$ and $R^7$ are independently a substituent group having a photopolymerizable carbon-carbon double bond, and m is 0 or 1.

In the polyamide acids, those having, at both terminals thereof, the actinic ray-sensitive functional group $Z^1$ represented by the formula (8) are represented by the following formula (10):

(10)

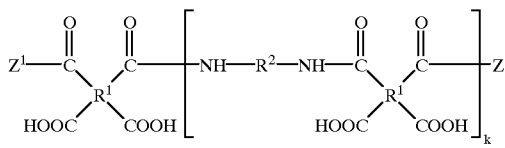

wherein $R^1$ is a tetravalent organic group, $R^2$ is a bivalent organic group, k is an integer of 5–10,000, and $Z^1$ is the actinic ray-sensitive functional group represented by the formula (8).

In the polyamide acids, those having, at both terminals thereof, the actinic ray-sensitive functional group $Z^2$ represented by the formula (9) are represented by the following formula (11):

(11)

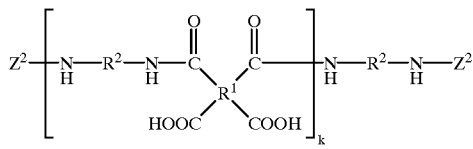

wherein $R^1$ is a tetravalent organic group, $R^2$ is a bivalent organic group, k is an integer of 5–10,000, and $Z^2$ is the actinic ray-sensitive functional group represented by the formula (9).

As examples of an aminobenzene derivative used for introducing the actinic ray-sensitive functional group $Z^1$ represented by the formula (8), may be mentioned compounds represented by the following formula (12):

(12)

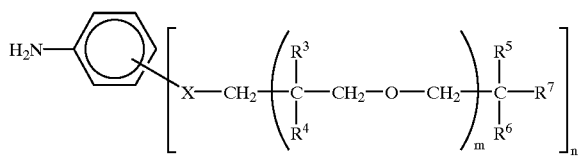

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are independently a substituent group having a photopolymerizable carbon-carbon double bond, m is 0 or 1, and n is an integer of 1–3.

Typical examples of the substituent group having a photopolymerizable carbon-carbon double bond include acryloyloxymethylene and methacryloyloxymethylene groups. Besides, alkenyl groups having 2–6 carbon atoms, such as vinyl, propenyl, isopropenyl, butenyl, pentenyl, hexenyl and 2-ethylbutenyl groups, and substituted groups thereof. Specific examples of substituents capable of being bonded to the alkenyl groups having 2–6 carbon atoms include halogen atoms, a phenyl group, alkenyl groups having 1–4 carbon atoms and alkoxy groups having 1–4 carbon atoms.

Preferable examples of the aminobenzene derivative include aminobenzenecarboxylic esters represented by the following formula (13):

(13)

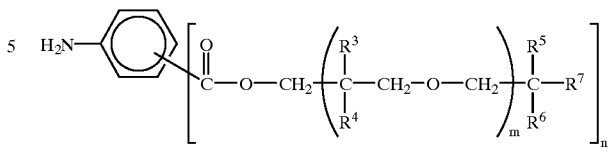

Such an aminobenzenecarboxylic ester can be prepared, for example, in accordance with a process described below. A nitrosobenzoyl halide represented by the formula (14) [in the formula (14), X means a halogen atom]:

(14)

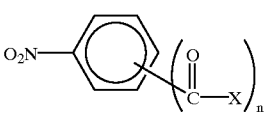

and an alcohol represented by the formula (15)

(15)

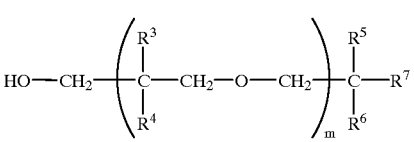

are first subjected to a dehydrohalogenation reaction to obtain a nitrosobenzene represented by the formula (16).

(16)

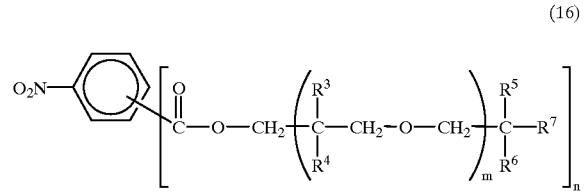

This nitrosobenzene is then reduced, whereby the aminobenzenecarboxylic ester can be obtained.

As examples of a trimellitic acid derivative used for introducing the actinic ray-sensitive functional group $Z^2$ represented by the formula (9), may be mentioned compounds represented by the following formula (17):

(17)

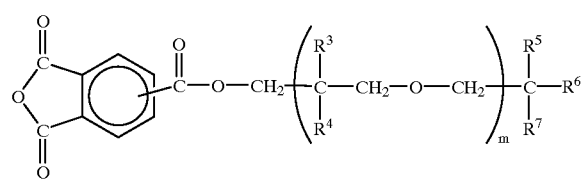

wherein $R^3$, $R^4$, $R^5$, $R^6$ and $R^7$ are independently a substituent group having a photopolymerizable carbon-carbon double bond, and m is 0 or 1.

Typical examples of the substituent group having a photopolymerizable carbon-carbon double bond include acryloyloxymethylene and methacryloyloxymethylene groups. Besides, alkenyl groups having 2–6 carbon atoms, such as vinyl, propenyl, isopropenyl, butenyl, pentenyl, hexenyl and 2-ethylbutenyl groups, and substituted groups thereof. Specific examples of substituents capable of being bonded to the alkenyl groups having 2–6 carbon atoms include halogen atoms, a phenyl group, alkenyl groups having 1–4 carbon atoms and alkoxy groups having 1–4 carbon atoms.

Such a trimellitic acid derivative can be synthesized, for example, by subjecting an anhydrotrimellityl halide represented by the formula (18) [in the formula (18), X means a halogen atom]:

(18)

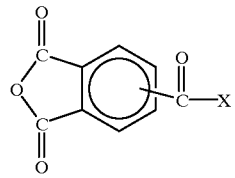

and an alcohol represented by the formula (19)

(19)

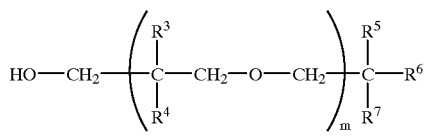

to a dehydrohalogenation reaction (esterification reaction).

Photosensitive Auxiliary

Typical examples of the photosensitive auxiliary include (meth)acrylic compounds such as pentaerythritol triacrylate.

Examples of the acrylic compounds include acrylic acid, methyl acrylate, ethyl acrylate, n-propyl acrylate, isopropyl acrylate, n-butyl acrylate, isobutyl acrylate, cyclohexyl acrylate, benzyl acrylate, carbitol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerythritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl) propane, 2,2-bis(4-acryloxypropoxyphenyl)propane, trimethylolpropane diacrylate, pentaerythritol diacrylate, trimethylolpropane triacrylate, pentaerythritol triacrylate, triacrylformal, tetramethylolmethane tetraacrylate, tris(2-hydroxyethyl) isocyanuric acid acrylate, (20)

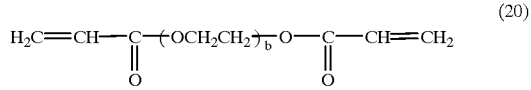

wherein b means an integer of 1–30, (21)

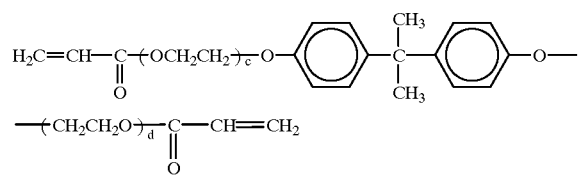

wherein c and d denote integers satisfying c+d=2–30, (22)

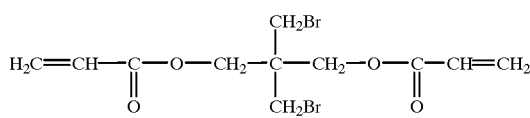

and (23)

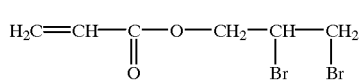

Examples of the methacrylic compounds include methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylamino methacrylate, N,N-diethylamino methacrylate, glycidyl methacrylate, tetrahydrofurfuryl methacrylate, methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl)propane, trimethylolpropane dimethacrylate, pentaerythritol dimethacrylate, trimethylolpropane trimethacrylate, pentaerythritol trimethacrylate, tetramethylolmethane tetramethacrylate, tris(2-hydroxyethyl) isocyanuric acid methacrylate, (24)

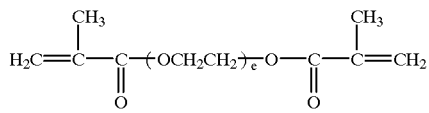

wherein e means an integer of 1–30, (25)

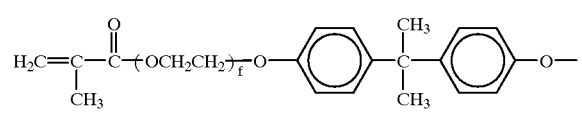

-continued

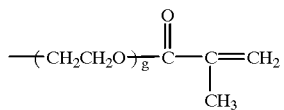

wherein f and g denote integers satisfying f+g=1–30, (26)

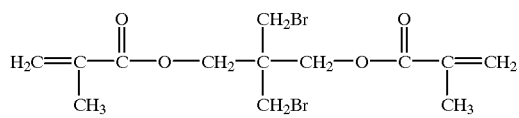

and (27)

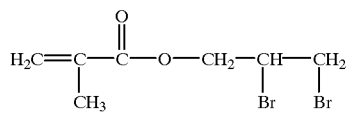

These compounds may be used either singly or in any combination thereof. Of these, pentaerythritol triacrylate and the compound (b=3) represented by the formula (20) are particularly preferred. Commercial products thereof include 3EG-A (product of Kyoeisha Chemical Co., Ltd.) and Biscoat 300 (product of Osaka Organic Chemical Ind. Co., Ltd.).

The photosensitive auxiliary is desirably used in a proportion of 10–40 parts by weight, preferably 15–35 parts by weight, more preferably 20–30 parts by weight, per 100 parts by weight of the polyamide acid.

Solvent

Examples of solvents used in the present invention include polar solvents such as N-methyl-2-pyrrolidone, N,N-dimethylacetamide, N,N-dimethylformamide, dimethyl sulfoxide, tetramethylurea, hexamethylphosphoric triamide, and γ-butyrolactone.

Besides these polar solvents, ketones such as acetone, methyl ethyl ketone, methyl isobutyl ketone and cyclohexanone; esters such as methyl acetate, ethyl acetate, butyl acetate, diethyl oxalate and diethyl malonate; ethers such as diethyl ether, ethylene glycol dimethyl ether, diethylene glycol dimethyl ether and tetrahydrofuran; halogenated hydrocarbons such as dichloromethane, 1,2-dichloroethane, 1,4-dichlorobutane, trichloroethane, chlorobenzene and o-dichlorobenzene; and hydrocarbons such as hexane, heptane, octane, benzene, toluene and xylene may also be used.

These solvent may be used either singly or in any combination thereof. Of these, N,N-dimethylacetamide and N-methyl-2-pyrrolidone are particularly preferred. The solvent is used in an amount sufficient to uniformly dissolve the individual components.

Photopolymerization Initiator

Examples of the photopolymerization initiator include Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9, 10-anthraquinone, anthraquinone, methylanthraquinone, 4,4'-bis-(diethylamino)benzophenone, acetophenone, benzophenone, thioxanthone, 1,5-acenaphthene, 2,2-dimethoxy- 2-phenylacetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acridine orange, erythrosine, 2-isopropylthioxanthone, 2,6-bis(p-diethylaminobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, aminostyryl ketone, 3-ketocoumarin compounds, biscoumarin compounds, N-phenylglycine, N-phenyldiethanolamine and 3,3',4,4'-tetra(t-butyl peroxycarbonyl)benzophenone.

The photopolymerization initiator is generally used in a proportion of 0–10 parts by weight, preferably 0.1–5 parts by weight, more preferably 1–5 parts by weight, per 100 parts by weight of the polyamide acid.

Other Additives

In the compositions according to the present invention, various kinds of additives such as an adhesion auxiliary, a leveling agent and a polymerization inhibitor may be further used as needed.

Usage of the Photosensitive Polyimide Resin Composition

The polyimide resin composition according to the present invention is used in the following manner. The composition is first coated on a suitable substrate, for example, a silicon wafer, or a ceramic or aluminum base. Examples of a coating process include spin coating making use of a spin coater, spray coating making use of a spray coater, dipping, printing and roll coating.

In the case where the composition contains the photosensitive polyimide resin, after the composition is then prebaked at a low temperature to dry the coating film, the coating film is exposed to active rays (actinic rays) in the desired pattern form. As the actinic rays, X-rays, electron rays, ultraviolet rays, visible rays and the like may be used. The unexposed portion is then dissolved in a developer to remove it, thereby obtaining a relief pattern.

As the developer, polar solvents such as N-methyl-2-pyrrolidone, N,N-dimethylacetamide and N,N-dimethylformamide, methanol, isopropyl alcohol, and water are used singly or in any combination thereof. In the case where the polyimide resin is alkali-soluble, an alkaline developer or an aqueous alkali solution may be used. As a developing process, there may be used various methods such as spray development, paddle development, dip development and ultrasonic development.

The relief pattern formed by the development is rinsed. Examples of a rinsing liquid include methanol, ethanol, isopropyl alcohol and butyl acetate. A heat treatment is then conducted to form an imide ring, thereby polyimidating the polyamide acid to obtain a final pattern having high heat resistance.

The photosensitive polyimide resin compositions according to the present invention can be used not only in applications related to semiconductor devices, but also as layer insulation films for multi-layer circuits, cover coats for flexible copper-clad sheets, solder resist films, alignment films for liquid crystals, and the like.

In particular, the resin compositions provided by the present invention have marked effects when they are used in the following applications.

(1) A polyamide acid is coated in the form of a varnish on a copper foil or copper wiring to heat and cure it, thereby forming an insulation film of polyimide on the copper layer.

(2) A photosensitive polyamide acid is used to form a pattern of polyimide on a copper or copper alloy wiring.

(3) A solvent-soluble polyimide is used to form a film of polyimide on a copper or copper alloy wiring.

(4) A photosensitive polyamide acid ester is used to form a pattern of polyimide on a copper or copper alloy wiring.

(5) A photosensitive polyimide is used to form a pattern of polyimide on a copper or copper alloy wiring.

EXAMPLES

The present invention will hereinafter be described specifically by the following Synthesis Examples, Examples and Comparative Examples. However, the present invention is not limited to these examples only.

Synthesis Example 1

While chilling with ice water and stirring, 88.87 g (0.276 mol) of 3,3',4,4'-benzophenonetetracarboxylic acid dianhydride were added as an acid anhydride by bits in the form of powder to a uniform solution composed of 52.8 g (0.264 mol) of 4,4'-diaminodiphenyl ether, 2.05 g (0.022 mol) of aniline and 754.5 g of N-methylpyrrolidone. A reaction was then conducted for 3 hours under chilling with ice water and subsequently for 20 hours at room temperature, thereby obtaining a solution containing a polyamide acid (Code No. A). In the following Examples and Comparative Examples, this solution was used.

Synthesis Example 2

While chilling with ice water and stirring, a mixture of 44.3 g (0.138 mol) of 3,3',4,4'-benzophenone-tetracarboxylic acid dianhydride and 30 g (0.138 mol) of pyromellitic dianhydride was added as an acid anhydride by bits in the form of powder to a uniform solution composed of 110.5 g (0.264 mol) of 2,2'-di(p-aminophenyl)-6,6'-bibenzoxazole, 2.05 g (0.022 mol) of aniline, 530 g of dimethylacetamide and 530 g of N-methylpyrrolidone. A reaction was then conducted for 3 hours under chilling with ice water and subsequently for 20 hours at room temperature, thereby obtaining a solution containing a polyamide acid (Code No. B). In the following Examples and Comparative Examples, this solution was used.

Synthesis Example 3

While chilling with ice water and stirring, a mixture of 44.3 g (0.138 mol) of 3,3',4,4'-benzophenone-tetracarboxlyic acid dianhydride and 30 g (0.138 mol) of pyromellitic dianhydride was added as an acid anhydride by bits in the form of powder to a uniform solution composed of 110.5 g (0.264 mol) of 2,2'-di(p-aminophenyl)-6,6'-bibenzoxazole, 10.1 g (0.022 mol) of tris(methacryloyl)pentaerythritol p-aminobenzoate, 552 g of dimethylacetamide and 552 g of N-methylpyrrolidone. A reaction was then conducted for 3 hours under chilling with ice water and subsequently for 20 hours at room temperature, thereby obtaining a solution containing a polyamide acid (Code No. C).

Then, 2 parts by weight of 3,3',4,4'-tetra(t-butyl peroxycarbonyl)benzophenone (BTTB; λmax=340 nm), 2 parts by weight of N-phenylglycine and 28 parts by weight of 3EG-A (product of Kyoeisha Chemical Co., Ltd.) as a photosensitive auxiliary were added to 666.7 parts by weight (100 parts by weight in terms of solids) of the low thermal expansion type polyamide acid solution in such a manner at room temperature into a solution. In the following Examples and Comparative Examples, this photosensitive polyamide acid solution was used.

The tris(methacryloyl)pentaerythritol p-aminobenzoate used herein was synthesized in accordance with the following process.

A reactor was charged with 13.1 g of pentaerythritol trimethacrylate, 4.1 g of triethylamine and 35 ml of methylene chloride. While chilling with ice water and stirring, 6.7 g of p-nitrosobenzoyl chloride and 25 ml of methylene chloride were added dropwise, and a reaction was then conducted for 2 hours under chilling ice water and subsequently for 2 hours at room temperature. After completion of the reaction, chloroform and water were added to the reaction mixture, and hydrochloric acid was then added to separate and collect a chloroform layer. Chloroform was distilled out of the chloroform layer under reduced pressure, and the resultant pale yellow oily substance was purified by column chromatography, thereby obtaining 15.1 g (yield: 85.8%) of tris(methacryloyl)pentaerythritol p-nitrobenzoate.

A reactor was then charged with 15.1 g of tris(methacryloyl)pentaerythritol p-nitrobenzoate obtained above, 35.1 g of stannous chloride and 150 ml of tetrahydrofuran. While chilling with ice water and stirring, hydrogen chloride gas was introduced therein. After a reaction was conducted for 1 hour under chilling ice water and subsequently for 1 hour at room temperature, water and sodium carbonate were added to the reaction mixture to weakly alkalify it. The reaction mixture was then extracted with chloroform. Chloroform was distilled out of the resultant chloroform layer under reduced pressure, and the residue was then purified by column chromatography, thereby obtaining 13.8 g (yield: 92.3%) of tris(methacryloyl) pentaerythritol p-aminobenzoate.

Examples 1–12, Comparative Examples 1–16

Their corresponding various additives shown in Table 1 were added to the respective polyamide acid solutions obtained in Synthesis Examples 1–3 to prepare uniform solutions. The compounding proportions of the various additive are expressed as parts by weight per 100 parts by weight of solids of the their corresponding polyamide acids. The respective solutions thus obtained were used to determine rates of residual film upon development, rates of residual film after curing and rates of residual film after treatment with sulfuric acid and further observe surface profile after the treatment with sulfuric acid in accordance with the following respective testing methods. The results are shown in Table 1.

(1) Determination Method of Rate of Residual Film:

Each sample solution was coated on a silicon wafer substrate, on which a copper sputtering film had been formed, by a spin coater and dried at 60° C. for 30 minutes by a dryer to form a film having a thickness of about 10 μm.

The wafer on which the film had been formed was exposed [at least 300 mJ/cm$^2$ (at 436 nm)] by means of an aligner PLA-501F manufactured by Canon Inc. using a step tablet mask manufactured by TOPPAN PRINTING CO., LTD. and then subjected to spray development with a mixed developer composed of 70 wt. % of N-methylpyrrolidone and 30 wt. % of isopropyl alcohol. The wafer was then rinsed with isopropyl alcohol to form a patter on a film of a polyimide processor. The thicknesses of residual films at exposed and unexposed portions of the film on which the pattern had been formed were measured by means of a tracer type surface-configuration-measuring device (P-10, manufactured by Tencall Co.) to calculate out the rate of residual film upon the development.

The wafer on which the pattern had been formed was heated for 1 hour at 1000C, for 1 hour at 200° C. and for 2 hours at 400° C. in a nitrogen atmosphere to cure (polyimidate) the polyimide processor. The thicknesses of residual films at exposed and unexposed portions of the resultant polyimide pattern were measured to calculate out the rate of residual film after the curing.

The thus-obtained polyimide pattern was treated for 2 minutes at 25° C. with a 2 vol. % aqueous solution of sulfuric acid. With respect to the polyimide pattern and throughhole parts, the surface profiles were observed through a scanning electron microscope (JSM 5400, manufactured by JEOL Ltd.), and moreover the thicknesses of residual films at exposed and unexposed portions were measured to calculate out the rate of residual film after the treatment with sulfuric acid.

The rate of residual film was determined by calculation from the thickness of the residual film at the unexposed portion obtained in each step.

(2) Evaluation Method of Surface Profile:

The surface profiles of the polyimide pattern and throughhole parts were observed through the scanning electron microscope (JSM 5400, manufactured by JEOL Ltd.) to evaluate them in terms of the following 4 ranks:

X: The polyimide film remained to a great extent,

Δ: The polyimide film remained to a slight extent,

○: The polyimide film remained to an extremely slight extent, and

⊙: No remaining polyimide film was observed.

TABLE 1

| | Kind of poly- amide acid | Kind of addi- tive | Compound- ing propor- tion of additive | Rate of residual film upon develop- ment | Rate of residual film after curing | Rate of residual film after sulfuric acid treatment | Surface profile |
|---|---|---|---|---|---|---|---|
| Ex. 1 | A | 1H-TE | 0.5 | 0.0 | 0.0 | 0.0 | ⊙ |
| Ex. 2 | B | 1H-TE | 0.5 | 0.0 | 0.0 | 0.0 | ⊙ |
| Ex. 3 | C | 1H-TE | 0.1 | 0.3 | 0.15 | 0.15 | |
| Ex. 4 | C | 1H-TE | 0.3 | 0.08 | 0.04 | 0.04 | |
| Ex. 5 | C | 1H-TE | 0.5 | 0.0 | 0.0 | 0.0 | ⊙ |
| Ex. 6 | C | 1H-TE | 1.0 | 0.0 | 0.0 | 0.0 | ⊙ |
| Ex. 7 | C | 1H-TE | 3.0 | 0.0 | 0.0 | 0.0 | ⊙ |
| Ex. 8 | C | 5M-TE | 0.5 | 0.0 | 0.0 | 0.0 | ⊙ |
| Ex. 9 | C | 5P-TE | 0.5 | 0.0 | 0.0 | 0.0 | ⊙ |
| Ex. 10 | C | 5A-TE | 0.5 | 0.0 | 0.0 | 0.0 | ⊙ |
| Ex. 11 | C | 1H-TE | 0.5 | 25.2 | 12.8 | 12.8 | Δ |
| Ex. 12 | C | 1P-5M-TE | 0.5 | 36.8 | 19.2 | 19.2 | Δ |
| Comp. Ex. 1 | A | — | — | 8.0 | 4.1 | 4.1 | Δ |
| Comp. Ex. 2 | B | — | — | 30.1 | 15.6 | 15.6 | Δ |
| Comp. Ex. 3 | C | — | — | 67.1 | 34.8 | 34.8 | X |
| Comp. Ex. 4 | C | CDA-1 | 0.5 | 42.1 | 21.8 | 21.6 | X |
| Comp. Ex. 5 | C | CDA-6 | 0.5 | 45.2 | 27.6 | 27.6 | X |
| Comp. Ex. 6 | C | ZS-27 | 0.5 | 43.0 | 22.3 | 22.3 | X |
| Comp. Ex. 7 | C | ZS-90 | 0.5 | 44.6 | 23.2 | 23.2 | X |
| Comp. Ex. 8 | C | IM | 0.5 | 71.0 | 36.2 | 36.2 | X |
| Comp. Ex. 9 | C | BIM | 0.5 | 72.5 | 37.7 | 37.5 | X |
| Comp. Ex. 10 | C | 2M-BIM | 0.5 | 46.6 | 24.2 | 24.2 | X |
| Comp. Ex. 11 | C | 1,2,4-TA | 0.5 | 18.2 | 9.5 | 9.5 | Δ |
| Comp. Ex. 12 | C | 3M-TA | 0.5 | 12.2 | 6.3 | 6.3 | Δ |
| Comp. Ex. 13 | C | 3M-TA | 0.5 | 16.2 | 8.4 | 8.4 | Δ |
| Comp. Ex. 14 | C | BTA | 0.5 | 27.3 | 14.2 | 14.2 | Δ |
| Comp. Ex. 15 | C | SA | 0.5 | 67.4 | 35.0 | 35.0 | X |
| Comp. Ex. 16 | C | 2,2'-BQ | 0.5 | 68.0 | 35.2 | 35.2 | X |

(Note)
1H-TE: 1H-Tetrazole,

TABLE 1-continued

| Kind of poly- amide acid | Kind of addi- tive | Compound- ing propor- tion of additive | Rate of residual film upon develop- ment | Rate of residual film after curing | Rate of residual film after sulfuric acid treatment | Surface profile |
|---|---|---|---|---|---|---|

5M-TE: 5-Methyl-1H-tetrazole,
5P-TE: 5-Phenyl-1H-tetrazole
5A-TE: 5-Amino-1H-tetrazole,
1M-TE: 1-Methyl-1H-tetrazole,
1P-5M-TE: 1-Phenyl-5-mercapto-1H-tetrazole,
CDA-1: Copper inhibitor produced by Asahi Denka Kogyo K. K.,
CDA-6: Copper inhibitor produced by Asahi Denka Kogyo K. K.,
ZS-27: Copper inhibitor produced by Asahi Denka Kogyo K. K. (triazine compound),
ZS-90: Copper inhibitor produced by Asahi Denka Kogyo K. K. (triazine compound),
IM: Imidazole,
BIM: Benzimidazole,
2M-BIM: 2-Mercapto-benzimidazole,
1,2,4-TA: 1,2,4-Triazole,
3M-TA: 3-Mercapto-1,2,4-triazole,
3A-TA: 3-Amino-1,2,4-triazole,
BTA: Benzotriazole,
SA: Salicyladloxim,
2,2'-BQ: 2,2'-Biquinoline.

The experimental results shown in Table 1 revealed that unsubstituted 1H-tetrazole and 5-substituted 1H-tetrazoles particularly exhibit excellent effects of preventing corrosion of copper. It is also understood that the ability to prevent corrosion of copper is improved by even 1-substituted 1H-tetrazoles (Examples 11–12) compared with Comparative Example 3.

Example 13

(Sensitivity and Resolution)

Three solutions in total of ① the photosensitive polyamide acid solution containing the polyamide acid (No. C) obtained in Synthesis Example 3, ② a solution with 1H-tetrazole compounded in a proportion of 0.5 parts by weight per 100 parts by weight (solids) of the polyamide acid into said photosensitive polyamide acid solution, and ③ a solution with 1H-tetrazole compounded in a proportion of 1 —part by weight per 100 parts by weight (solids) of the polyamide acid into said photosensitive polyamide acid solution were prepared.

Each of these solutions was coated on a silicon wafer by a spin coater and dried at 60° C. for 30 minutes by a dryer to form a film having a thickness of about 10 μm. After the formation of the film, the silicon wafer on which the film had been formed was exposed by means of an aligner PLA-501F manufactured by Canon Inc. using a step tablet mask manufactured by TOPPAN PRINTING CO., LTD. and then subjected to spray development with a mixed developer composed of 70 wt. % of N-methylpyrrolidone and 30 wt. % of isopropyl alcohol. In all the three samples, a pattern was able to be obtained at portions to which energy of exposure of at least 50 mJ/cm² (at 436 nm) was applied. No difference arose among them.

The respective silicon wafers on which the film had been formed were exposed at energy of exposure of 300 mJ/cm² (at 436 nm) by means of the PLA-501F using a resolution-evaluating mask manufactured by TOPPAN PRINTING CO., LTD. and then subjected to the same development as described above. As a result, even a pattern having lines and spaces at intervals of 10 μm was able to be resolved by all the three samples.

The above experimental results revealed that the addition of 1H-tetrazole does not adversely affect the sensitivity and resolution.

Example 14

Influence on Substrate

A solution with 1H-tetrazole compounded in a proportion of 0.5 parts by weight per 100 parts by weight (solids) of the polyamide acid into the photosensitive polyamide acid solution obtained in Synthesis Example 3 was coated by a spin coater on each substrate of (i) a silicon wafer, (ii) a silicon wafer on which a copper sputtering film had been formed, and (iii) a wafer substrate obtained by forming a polyimide film on a silicon wafer, and dried at 60° C. for 30 minutes by a dryer to form a film having a thickness of about 10 μm on each substrate. Each of the silicon wafers on which the film had been formed was exposed by means of an aligner PLA-501F manufactured by Canon Inc. using a step tablet mask manufactured by TOPPAN PRINTING CO., LTD. and then subjected to spray development with a mixed developer composed of 70 wt. % of N-methylpyrrolidone and 30 wt. % of isopropyl alcohol. In all the three substrates, a pattern was able to be obtained at portions to which energy of exposure of at least 50 mJ/cm² (at 436 nm) was applied. No difference arose among the three samples.

The respective silicon wafers on which the film had been formed were exposed at energy of exposure of 300 mJ/cm² (at 436 nm) by means of the PLA-501F using a resolution-evaluating mask manufactured by TOPPAN PRINTING CO., LTD. and then subjected to the same development as described above. As a result, even a pattern having lines and spaces at intervals of 10 μm was able to be resolved by all the three samples.

The above experimental results revealed that the addition of 1H-tetrazole does not adversely affect the substrates.

Example 15

Elongation at Break

Three solutions in total of ① the photosensitive polyamide acid solution containing the polyamide acid (No. C)

obtained in Synthesis Example 3, ② a solution with 1H-tetrazole compounded in a proportion of 0.5 parts by weight per 100 parts by weight (solids) of the polyamide acid into said photosensitive polyamide acid solution, and ③ a solution with 1H-tetrazole compounded in a proportion of 1 part by weight per 100 parts by weight (solids) of the polyamide acid into said photosensitive polyamide acid solution were prepared.

Each of these solutions was coated on a silicon wafer by a spin coater and dried at 60° C. for 30 minutes by a dryer to form a film having a thickness of about 10 µm. These silicon wafers on which the film had been formed were then heated for 1 hour at 100° C., for 1 hour at 200° C. and for 2 hours at 400° C. in a nitrogen atmosphere to cure (polyimidate) the polyimide processor. The polyimide films each had a thickness of about 5 µm. The polyimide films were separated to measure their elongation (%) at break.

The measurement of the elongation at break was conducted by means of a TCM-500 manufacture by MINEBEA CO., LTD. under conditions of a head speed of 2 mm/min, chart/head of 50, a chart speed of 100 mm/min and a gage length of 20 mm in accordance with JIS K 7113. Three samples were used every film to measure their elongation at break, thereby finding an average value thereof. The results were as follows.

① 1H-Tetrazole, not compounded: 8.98%
② 1H-Tetrazole, 0.5 parts by weight: 9.84%
③ 1H-Tetrazole, 1.0 part by weight: 11.40%.

The above experimental results revealed that the elongation at break of each polyimide film is improved by the addition of 1H-tetrazole.

INDUSTRIAL APPLICABILITY

According to the present invention, there are provided polyimide resin compositions for electronic materials, which have excellent effects on copper and copper alloys for preventing rust, preventing a film formed from remaining without being dissolved and causing a film cured to closely adhere without need of plating and any surface treatment with a rust preventive.

The polyimide resin compositions according to the present invention excellently inhibit the side reactions of the polyamide acid with copper and copper alloys and have an excellent rust preventing effect on metals. The polyimide films obtained by using the polyimide resin compositions according to the present invention are excellent in stability of mechanical strength and the effect of retaining good adhesion between the films and metals and are hence effective for preventing the occurrence of various problems such as insulation failure and interlayer separation. Further, the photosensitive polyimide resin compositions exhibit a particularly excellent effect of preventing a film formed on a copper wiring from remaining without being dissolved at unexposed portions thereof caused by the generation of copper ions.

The polyimide resin compositions according to the present invention can also be used as surface-protecting films and layer insulation films (including layer insulation films for multi-layer circuits) for semiconductor devices, cover coats for flexible copper-clad sheets, solder resist films, alignment films for liquid crystals, and the like.

What is claimed is:

1. A polyimide resin composition comprising at least one polyimide resin (A) comprising a photosensitive polyimide resin or a polyimide resin precursor selected from the group consisting of photosensitive polyamide acids and photosensitive polyamide acid esters, and at least one 1H-tetrazole (B) selected from the group consisting of 1H-tetrazole, a 5-substituted 1H-tetrazole, a 1-substituted 1H-tetrazole, 5,5'-bis-1H-tetrazole, and a derivative of 5,5'-bis-1H-tetrazole, wherein the photosensitive polyimide resin, photosensitive polyamide acid or photosensitive polyamide acid ester comprises a photosensitive auxiliary, a photopolymerization initiator and a sensitizer.

2. The polyimide resin composition according to claim 1, wherein the 1H-tetrazole (B) is 1H-tetrazole, a 5-substituted 1H-tetrazole, or a 1-substituted 1H-tetrazole represented by the following formula (1):

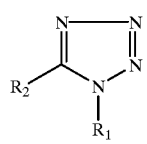

(1)

wherein $R_1$ is a hydrogen atom, an alkyl group having 1–10 carbon atoms, an alkenyl group having 2–10 carbon atoms, an allyl group having 3–10 carbon atoms, an alicyclic group having 3–6 carbon atoms, a phenyl group, a substituted phenyl group represented by the following formula (3):

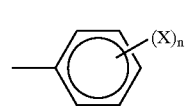

(3)

wherein n is an integer of 1–3, and X is an alkyl group having 1–10 carbon atoms, an alkoxyl group having 1–10 carbon atoms, —NR'R" (R' and R" are independently a hydrogen atom or a methyl, ethyl, acetyl or ethylcarbonyl group), —COOH, —COOCH$_3$, —NO$_2$, —OH, —SH or —SCH$_3$, or a substituted methyl group represented by the following formula (4):

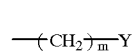

(4)

wherein m is an integer of 1–10, and Y is —COOH, —NR'R" (R' and R" are independently a hydrogen atom or a methyl, ethyl, acetyl or ethylcarbonyl group), a phenyl group or a substituted phenyl group represented by the formula (3); and $R_2$ is a hydrogen atom, a hydroxyl group, a cyano group, an alkyl group 1–10 carbon atoms, an alkenyl group having 2–10 carbon atoms, an alkinyl group having 2–10 carbon atoms, an alicyclic group having 3–6 carbon atoms, a phenyl group, a substituted phenyl group, —OR$_3$ (R$_3$ is an alkyl group 1–10 carbon atoms, an alkenyl group having 2–10 carbon atoms, an alkinyl group having 2–10 carbon atoms, a phenyl group or a substituted phenyl group represented by the formula (3)), a substituted methyl group represented by the following formula (5):

(5)

wherein k is an integer of 1–10, and Z is a halogen atom, an amino group, —NR'R" (R' and R" are independently a hydrogen atom or a methyl, ethyl, acetyl or ethylcarbonyl group), a phenyl group, a substituted phenyl group represented by the formula (3), —SH, —SR₄ (R₄ is an alkyl group 1–10 carbon atoms, an alkenyl group having 2–10 carbon atoms, an alkinyl group having 2–10 carbon atoms, a phenyl group or a substituted phenyl group represented by the formula (3)), —C(NH₂)H—(CH₂)ₙ—CH₃ (n: 1–5) or —C(NHCH₃)H—(CH₂)ₙ—CH₃ (n: 0–5), or a group represented by the following formula (6):

  (6)

wherein A is —CO—, —NHCO—, —C(=N—OH)—, —CH(OH)—, —CH(NH₂)—, —CH(Cl)— or —CH(Br)—, and R₅ is an alkyl group having 1–20 carbon atoms, an alkenyl group having 2–20 carbon atoms, an alicyclic group having 3–6 carbon atoms, a phenyl group, a substituent phenyl group represented by the formula (3), a substituted methyl group represented by the formula (5) or a group represented by the following formula (7):

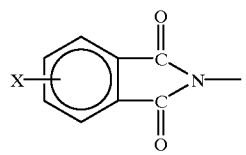  (7)

wherein X is an alkyl group having 1–10 carbon atoms, an alkoxyl group having 1–10 carbon atoms, an amino group, —NR'R" (R' and R" are a hydrogen atom or a methyl, ethyl, acetyl or ethylcarbonyl group), —COOH, —COOCH₃, —NO₂, —OH, —SH or —SCH₃.

3. The polyimide resin composition according to claim 1 wherein the 1H-tetrazole (B) is 5,5'-bis-1H-tetrazole or a derivative thereof represented by the following formula (2):

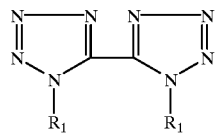  (2)

wherein
R₁ is a hydrogen atom, an alkyl group having 1–10 carbon atoms, an alkenyl group having 2–10 carbon atoms, an allyl group having 3–10 carbon atoms, an alicyclic group having 3–6 carbon atoms, a phenyl group, a substituted phenyl group represented by the following formula (3):

  (3)

wherein n is an integer of 1–3, and X is an alkyl group having 1–10 carbon atoms, an alkoxyl group having 1–10 carbon atoms, —NR'R" (R' and R" are independently a hydrogen atom or a methyl, ethyl, acetyl or ethylcarbonyl group), —COOH, —COOCH₃, —NO₂, —OH, —SH or —SCH₃, or a substituted methyl group represented by the following formula (4):

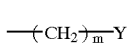  (4)

wherein m is an integer of 1–10, and Y is —COOH, —NR'R" (R' and R" are independently a hydrogen atom or a methyl, ethyl, acetyl or ethylcarbonyl group), a phenyl group or a substituted phenyl group represented by the formula (3).

4. The polyimide resin composition according to claim 1, wherein the 1H-tetrazole (B) is 1H-tetrazole or a 5-substituted 1H-tetrazole.

5. The polyimide resin composition according to claim 1, wherein the 5-substituted 1H-tetrazole is 5-methyl-iH-tetrazole, 5-phenyl-1H-tetrazole or 5-amino-1H-tetrazole.

6. The polyimide resin composition according to claim 1, which comprises the 1H-tetrazole (B) in a proportion of 0.05–20 parts by weight per 100 parts by weight of the polyimide resin (A).

7. The polyimide resin composition according to claim 1, wherein the polyimide resin composition further comprises a solvent in an amount sufficient to uniformly dissolve the individual components.

8. A polyimide resin composition comprising at least one polyimide resin (A) comprising a polyimide resin precursor selected from the group consisting of photosensitive polyamide acids and photosensitive polyamide acid esters, and at least one 1H-tetrazole (B) selected from the group consisting of 1H-tetrazole, a 5-substituted 1H-tetrazole, a 1-substituted 1H-tetrazole, 5,5'-bis-1H-tetrazole, and a derivative of 5,5'-bis-1H-tetrazole.

* * * * *

UNITED STATES PATENT AND TRADEMARK OFFICE
CERTIFICATE OF CORRECTION

PATENT NO. : 6,310,135 B1
DATED : October 30, 2001
INVENTOR(S) : Akira Tanaka et al.

It is certified that error appears in the above-identified patent and that said Letters Patent is hereby corrected as shown below:

Column 26, claim 5,
Line 31, change "5-methyl-iH-" to -- 5-methyl-1H- --.

Signed and Sealed this

Twelfth Day of March, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,310,135 B1
DATED : October 30, 2001
INVENTOR(S) : Akira Tanaka et al.

It is certified that error appears in the above-identified patent and that said Letters Patent is hereby corrected as shown below:

<u>Title page,</u>
Item [73], after "Nippon Zeon Co., Ltd., Tokyo (JP)" insert -- Fujitsu Limited, Kanagawa (JP) --.

Signed and Sealed this

Third Day of June, 2003

JAMES E. ROGAN
*Director of the United States Patent and Trademark Office*